United States Patent
Wang et al.

(10) Patent No.: US 9,666,339 B2
(45) Date of Patent: May 30, 2017

(54) METHOD AND APPARATUS FOR FORMING ORIENTED NANOWIRE MATERIAL AND METHOD FOR FORMING CONDUCTIVE STRUCTURE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ruiyong Wang, Beijing (CN); Feng Bai, Beijing (CN); Yiming Zhao, Beijing (CN); Tao Ren, Beijing (CN); Zhen Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/096,745

(22) Filed: Apr. 12, 2016

(65) Prior Publication Data

US 2016/0225491 A1   Aug. 4, 2016

Related U.S. Application Data

(62) Division of application No. 14/499,783, filed on Sep. 29, 2014, now Pat. No. 9,343,203.

(30) Foreign Application Priority Data

Jun. 27, 2014   (CN) .......................... 2014 1 0302427

(51) Int. Cl.
*H01L 31/18* (2006.01)
*H01B 13/00* (2006.01)
(Continued)

(52) U.S. Cl.
CPC .......... *H01B 13/0016* (2013.01); *C30B 7/02* (2013.01); *C30B 29/02* (2013.01); *C30B 29/60* (2013.01);
(Continued)

(58) Field of Classification Search
CPC ......... H01L 2924/00; H01L 2924/0002; H01L 21/02628; H01L 2924/13091; H01L 31/1884
See application file for complete search history.

(56) References Cited

PUBLICATIONS

NPL Xiaolin (langmuir . . . Bulk Materials).*

* cited by examiner

*Primary Examiner* — Tony Tran
(74) *Attorney, Agent, or Firm* — Nath, Goldberg & Meyer; Joshua B. Goldberg

(57) ABSTRACT

The present invention provides a method and an apparatus for forming an oriented nanowire material as well as a method for forming a conductive structure, which can be used to solve the problem of imperfect process for forming oriented nanowire material in prior art. The method for forming an oriented nanowire material of the present invention comprises: forming a liquid film in a closed frame by a dispersion containing nanowires; expanding the closed frame in a first direction so that the liquid film expands in the first direction along with the closed frame; contracting the closed frame in the first direction so that the liquid film contracts in the first direction along with the closed frame; transferring the contracted liquid film to a substrate; and curing the liquid film to form an oriented nanowire material on the substrate.

6 Claims, 4 Drawing Sheets

(51) Int. Cl.
*H01L 29/06* (2006.01)
*C30B 7/02* (2006.01)
*C30B 29/02* (2006.01)
*C30B 29/60* (2006.01)
*H01B 1/02* (2006.01)
*H01B 1/04* (2006.01)
*H01B 13/32* (2006.01)

(52) U.S. Cl.
CPC ............... *H01B 1/02* (2013.01); *H01B 1/026* (2013.01); *H01B 1/04* (2013.01); *H01B 13/0026* (2013.01); *H01B 13/322* (2013.01); *H01L 29/0673* (2013.01); *H01L 31/1884* (2013.01)

METHOD AND APPARATUS FOR FORMING ORIENTED NANOWIRE MATERIAL AND METHOD FOR FORMING CONDUCTIVE STRUCTURE

FIELD OF THE INVENTION

The present invention relates to the technical field of preparation of oriented nanowire material. More particularly, the present invention relates to a method and an apparatus for forming an oriented nanowire material, as well as a method for forming a conductive structure.

BACKGROUND OF THE INVENTION

Nanomaterials refer to materials of which a single unit is sized (in at least one dimension) between 1 and 1000 nanometers ($10^{-9}$ meter). Due to the effects resulted by its small size, such as interface effect, quantum size effect and so on, it possess many special properties, and thus has been widely used in many applications.

A nanowire, which is one type of nanomaterials, refers to a wire material of which the radial size is of the order of a nanometer and the longitudinal size is much larger than the radial size. Many different types of nanowires exist. For example, depending on different constitutional materials, there are metallic nanowires (e.g., nanowires composed of Ni, Pt, Au, Ag, etc.), semiconducting nanowires (e.g., nanowires composed of Si, InP, GaN, etc.), and insulating nanowires (e.g., nanowires composed of $SiO_2$, $TiO_2$, etc.). An important usage of conductive nanowires (for example silver nanowires) is used for producing electrodes such as the grids of an array substrate, lead wires and so on. In order to make an electrode made of conductive nanowires having better conductivity, the nanowires should be oriented, that is to say, the nanowires should be distributed substantially along the current transmission direction.

The current methods for forming oriented nanowire materials include masking method, electromagnetic field-aid growing method, dipping method, LB method (Langmuir-Blodgett method), etc. However, all these methods are not perfect and have some defects such as high demands for process conditions, limited application, unsuitability for large-size structures, and inferior orientation of products and so on.

SUMMARY OF THE INVENTION

An object of the present invention is to provide a simple and practicable method for forming an oriented nanowire material, which can be used to form large-size products having good orientation, so as to solve the problem of the imperfect process for forming the oriented nanowire material in prior art.

The above object is realized by a method for forming an oriented nanowire material, comprising:

forming a liquid film in a closed frame by a dispersion containing nanowires;

expanding the closed frame in a first direction so that the liquid film expands in the first direction along with the closed frame;

contracting the closed frame in the first direction so that the liquid film contracts in the first direction along with the closed frame;

transferring the contracted liquid film to a substrate; and curing the liquid film to form the oriented nanowire material on the substrate.

Another object of the present invention is to provide a method for forming a conductive structure, comprising:

S1: forming a liquid film in a closed frame by a dispersion containing conductive nanowires;

S2: expanding the closed frame in a first direction so that the liquid film expands in the first direction along with the closed frame;

S3: contracting the closed frame in the first direction so that the liquid film contracts in the first direction along with the closed frame;

S4: transferring the liquid film to a substrate; and

S5: curing the liquid film to form a first conductive film composed of an oriented conductive nanowire material on the substrate.

Preferably, the conductive nanowires comprise any one or more of silver nanowire, gold nanowire, copper nanowire and carbon nanotube.

Preferably, the conductive nanowires have a diameter in a range of 10 to 200 nm and a length/diameter ratio of 100 or more.

Preferably, the dispersion comprises thickening agent, surfactant and deionized water. The dispersion preferably has a viscosity in a range of 10 cP to 100 cP.

Preferably, the content percentage of the conductive nanowires in the dispersion is in a range of 0.1% to 5.0% by mass, based on the total mass of the dispersion.

Preferably, the closed frame is constructed by two supporting units and two mobile units, wherein the two supporting units are disposed at an interval and are parallel to the first direction, and wherein the two mobile units are disposed at an interval and are perpendicular to the first direction and at least one of the mobile units is capable of moving in the first direction.

Preferably, in the steps of expanding the closed frame in the first direction (or step S2) and contracting the closed frame in the first direction (or step S3), the ambient temperature is 25 to 30° C., the ambient relative humidity is 70% to 90%, and the expanding rate and the contracting rate are both in a range of 3 m/min to 5 m/min.

Preferably, the size of the liquid film in the first direction after being contracted is ⅙ to ½ of the size of the liquid film in the first direction after being expanded.

Preferably, the step of transferring the contracted liquid film to a substrate (or step S4) comprises: contacting the surface of the substrate with the liquid film so as to transfer the liquid film to the substrate.

Preferably, the step of curing the liquid film (or step S5) comprises: curing the liquid film by heating, which includes heating at a temperature of 50 to 70° C. for 80 to 100 seconds and then heating at a temperature of 130 to 150° C. for 80 to 100 seconds.

Preferably, the method for forming a conductive structure further comprises step S6: forming the conductive structure by the first conductive film by a patterning process.

Preferably, between steps S5 and S6, steps S1 to S5 are repeated to form additional conductive film(s) composed of the oriented conductive nanowire material on the substrate, wherein the additional conductive film(s) and the first conductive film are disposed to overlap each other, and the directions of the oriented conductive nanowires in each conductive films are different from each other.

Preferably, the size of the liquid film in the direction perpendicular to the first direction is in a range of 10 to 400 mm, the size of the liquid film in the first direction before being expanded is 0.3 mm or less, the size of the liquid film in the first direction after being expanded and before being contracted is in a range of 60 to 1000 mm, and the size of the liquid film in the first direction after being contracted is in a range of 10 to 300 mm.

Preferably, the conductive structure comprises any one or more of touch electrode, grid electrode, pixel electrode, source electrode and drain electrode.

Yet another object of the present invention is to provide an apparatus for forming an oriented nanowire material, comprising:

a closed frame, which is used for forming a liquid film therein by a dispersion containing nanowires, and which is capable of expanding and contracting in a first direction so that the nanowires in the dispersion can be oriented.

Preferably, the apparatus for forming an oriented nanowire material further comprises a driving unit used for driving the closed frame to move.

For example, the apparatus for forming an oriented nanowire material may further comprises a motor, a hydraulic mechanism and the like to drive the closed frame (supporting units and mobile units) to move up and down, thereby facilitating the transference of the liquid film to the substrate; and/or to drive the mobile units to expand or contract in the first direction to make the nanowires oriented.

Preferably, the closed frame is constructed by two supporting units and two mobile units, wherein the two supporting units are disposed at an interval and are parallel to the first direction, and wherein the two mobile units are disposed at an interval and are perpendicular to the first direction and at least one of the mobile units is capable of moving in the first direction. More preferably, the closed frame is a rectangle frame so as to insure the tension at every point of the liquid film is the same during the expanding and contracting.

Preferably, the vertical distance between the two supporting units disposed at an interval is 10 to 400 mm.

Further preferably, at least one of the mobile units has an injection hole, a slit and a channel, wherein the channel is disposed inside the mobile unit for connecting the injection hole with the slit, the injection hole is used for adding the dispersion containing nanowires into the mobile unit, and the slit is disposed at the side of the mobile unit opposite to the other mobile unit such that a liquid film is formed between the two mobile units when the dispersion containing nanowires flows out of the slit.

According to the method for forming an oriented nanowire material of the present invention, nanowires with good orientation (perpendicular to the first direction) can be obtained during the expanding and contracting of the liquid film, thereby improving the properties of the nanowire material. Moreover, the apparatus and process conditions required by this method are simple and practicable, and large-size products with good orientation can be obtained through this method.

DETAILED DESCRIPTION OF CERTAIN EMBODIMENTS

Figure 1:
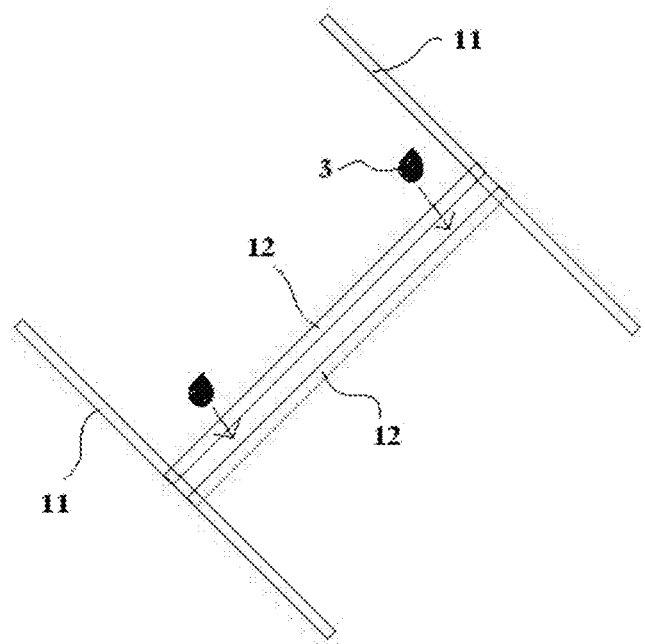
FIG. 1 is a schematic view showing the application of a dispersion to a closed frame according to the method for forming a conductive structure of the present invention.

The present invention will be further described below in details with reference to the accompanying drawings and specific embodiments in order to make the person skilled in the art better understand the technical solution of the present invention.

In one embodiment, a method for forming an oriented nanowire material according to the present invention (refer to FIGS. 1-5) comprises:

S101: forming a liquid film in a closed frame by a dispersion containing conductive nanowires.

S102: expanding the closed frame in a first direction so that the liquid film expands in the first direction along with the closed frame.

S103: contracting the closed frame in the first direction so that the liquid film contracts in the first direction along with the closed frame.

S104: transferring the contracted liquid film to a substrate.

S105: curing the liquid film to form the oriented nanowire material on the substrate.

Preferably, the method for forming an oriented nanowire material according to the present embodiment is used in forming a conductive film layer of the oriented conductive nanowire material. However, it should be understood that the method for forming an oriented nanowire material according to the present embodiment may also be used in forming any other oriented nanowire materials such as oriented nanowire materials used for forming optical devices and electromagnetic devices.

In another embodiment, the method for forming a conductive structure according to the present invention (refer to FIGS. 1-5) comprises:

S201: forming a liquid film 31 in a closed frame by a dispersion 3 containing conductive nanowires 4;

S202: expanding the closed frame in a first direction so that the liquid film 31 expands in the first direction along with the closed frame;

S203: contracting the closed frame in the first direction so that the liquid film 31 contracts in the first direction along with the closed frame;

S204: transferring the contracted liquid film 31 to a substrate 9; and S205: curing the liquid film 31 to form a first conductive film composed of an oriented conductive nanowire material on the substrate 9.

First, the conductive nanowires 4 are added into the dispersion 3 to form a mixed solution in which the conductive nanowires 4 are uniformly and stably dispersed in the dispersion 3.

The conductive nanowires 4 are nanowires with conductive property which may be made of any material having conductivity. Preferably, the conductive nanowire 4 comprises any one or more of silver nanowire, gold nanowire, copper nanowire and carbon nanotube.

In S101 or S201, the dispersion 3 is any liquid used for dispersing the nanowires material and may be commercially available product such as ClearOhm ink from Cambrios Company (USA) and Silver nanowire ink from Nanopyxis Company (Korea). The dispersion 3 generally comprises thickening agent, surfactant and deionized water, wherein the thickening agent is preferably celluloses and the amount thereof is 0.01% to 1% by mass of the total mass of the dispersion; the surfactant is preferably fluorinated surfactant and the amount thereof is 0.05% to 1% by mass of the total mass of the dispersion. Preferably the dispersion 3 has a viscosity in a range of 10 to 100 cP. The viscosity is measured according a method for measuring kinematic viscosity at ambient 25° C., 1 atm, and relative humidity (RH %) 70%. Herein, the relative humidity refers to the percent ratio of the partial pressure of water vapor in air to the saturation vapor pressure of water at the same temperature. The specific components of the dispersion 3 are not particularly limited as they are known to the person skilled in the art.

Preferably, the conductive nanowire 4 may have a diameter in a range of 10 to 200 nm and have a length/diameter ratio of 100 or more. The content percentage of the conductive nanowires 4 in the dispersion 3 is in a range of 0.1 to 5.0% by mass, based on the total mass of the dispersion 3.

The inventor did research and found that using the conductive nanowires 4 with such parameter ranges and addition amount can result in a product exhibiting best orientation property.

Figure 2:
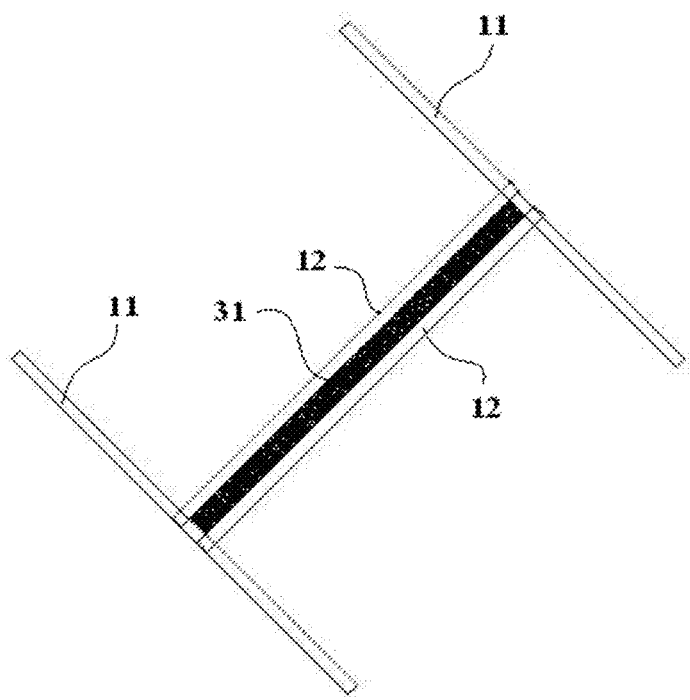
FIG. 2 is a schematic view showing formation of a liquid film in a closed frame by a dispersion according to the method for forming a conductive structure of the present invention.

Next, as shown in FIG. 1, the dispersion 3 containing the conductive nanowires 4 is applied to the closed frame in a manner of, for example, dropwise adding, pouring and so on. The dispersion 3 containing the conductive nanowires 4 will spread over the closed frame and form a liquid film 31 inside the closed frame in the effect of capillarity action and surface tension, as shown in FIG. 2.

Preferably, the closed frame is constructed by two supporting units 11 and two mobile units 12, wherein the two supporting units 11 are disposed at an interval and are parallel to the first direction, and the two mobile units 12 are disposed at an interval and are perpendicular to the first direction, wherein at least one of the mobile units 12 is capable of moving in the first direction. The vertical distance between the two supporting units 11 disposed at an interval may be 10 to 400 mm.

Figure 3:
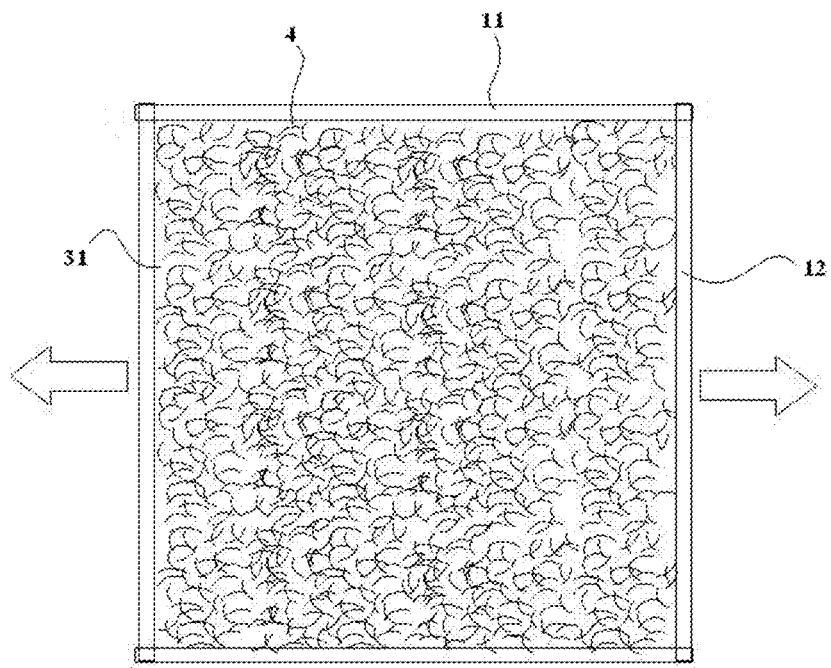
FIG. 3 is a schematic view showing expanding of a liquid film according to the method for forming a conductive structure of the present invention.
Figure 4:
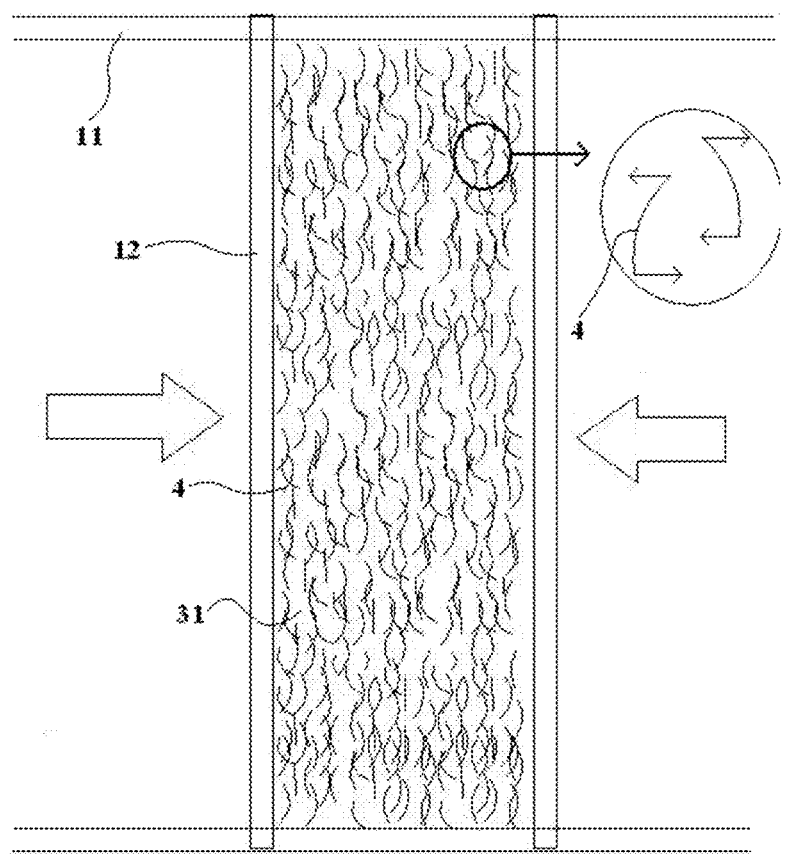
FIG. 4 is a schematic view showing contracting of a liquid film according to the method for forming a conductive structure of the present invention.

As shown in FIGS. 3-4, a simplest form of the closed frame can be a rectangle frame constructed by four portions, in which two mobile units 12 are connected movably with the two supporting units 11, so that the expanding or contracting of the closed frame in the first direction can be realized when one or two of the mobile units 12 move in the first direction.

Preferably, the supporting units 11 can be in the form of supporting blocks, supporting rods, etc., the mobile units 12 can be in the form of sliders, pull rods, etc., and the connection types of the supporting units 11 with the mobile units 12 can be slide rail, lap joint, plug joint (for example, the end of the mobile units 12 plugs in the slot on the inner wall of the supporting units 11), etc., as long as they can surround into a closed frame and at least one of the mobile units 12 can move in the first direction while the closed frame is maintained.

Preferably, at least one of the mobile units 12 has an injection hole, a slit and a channel, wherein the channel is disposed inside the mobile unit 12 for connecting the injection hole with the slit, the injection hole is used for adding the dispersion 3 containing the nanowires 4 into the mobile unit 12, and the slit is disposed at the side of the mobile unit 12 opposite to the other mobile unit 12 such that a liquid film 31 is formed between the two mobile units 12 when the dispersion 3 containing the nanowires 4 flows out of the slit.

Since the mobile unit 12 is provided with an injection hole connecting to the slit at the inner side of the mobile unit 12, the dispersion 3 can flow out of the slit and form into the liquid film 31 as long as dropping the dispersion 3 from the injection hole.

Of course, the closed frame may be in other forms, for example, it may be made of an elastic material, wherein the expanding of the closed frame can be realized by stretching of the elastic material, which is not particularly limited herein.

Preferably, the original size of the liquid film 31 in the first direction is 0.3 mm or less, and the size thereof in the direction perpendicular to the first direction is between 10 mm and 400 mm.

It should be understood that the original size of the liquid film 31 in the first direction is necessarily small enough to ensure the dispersion 3 can be formed into the liquid film 31 between the two mobile units 12. The size of the liquid film 31 in the direction perpendicular to the first direction is the final size of the result product in the same direction. If the size is too small, the product would not be practical, whereas if the size is too large, the liquid film 31 would not be maintained. It is found that the above size range is much suitable.

In step S102 or S202, the closed frame is expanded in the first direction so that the liquid film 31 expands in the first direction along with the closed frame.

As shown in FIG. 3, the size of the closed frame in the first direction can be increased by moving the above-mentioned mobile units 12 (moving one mobile unit 12, or moving two mobile units 12 at the same time), meanwhile the size of the liquid film 31 in the closed frame is increased correspondingly. That is to say, the liquid film 31 is "stretched" in the first direction.

The liquid film 31 can be stretched to a suitable size range without being broken because the dispersion 3 has a given viscosity.

During the "stretching" of the liquid film 31, there is a change in the distribution of the conductive nanowires 4, which are originally uniformly and randomly dispersed in the liquid film 31, thus paving the way for the subsequent orientation although at this time the conductive nanowires 4 are not oriented on the whole.

Preferably, the operation conditions for expanding the liquid film 31 in the first direction comprise: the ambient temperature is 25 to 30° C., the ambient relative humidity is 70 to 90%, and the expanding rate is in a range of 3 to 5 m/min. Preferably, the size of the liquid film 31 in the first direction after expanding is between 60 mm and 1000 mm.

It is understood that the liquid film 31 is much fragile since it is maintained only by viscosity and tension. It is found that expanding the liquid film 31 under the above conditions of temperature, humidity and rate can ensure the liquid film 31 not to be broken during expanding and can easily obtain the liquid film 31 with enough size.

In step S103 or S203, the closed frame is contracted in the first direction so that the liquid film 31 contracts in the first direction along with the closed frame.

As shown in FIG. 4, the size of the closed frame in the first direction can be decreased by moving the above-mentioned mobile units 12 (moving one mobile unit 12, or moving two mobile units 12 at the same time), meanwhile the size of the liquid film 31 in the closed frame is decreased correspondingly. That is to say, the liquid film 31 is "compressed" in the first direction.

During this process, due to the influence of various factors such as viscosity of the dispersion 3, the molecular force among the conductive nanowires 4 themselves, and the huge length/diameter ratio of the conductive nanowires 4, the two ends of the conductive nanowires 4 suffer from different forces such that the conductive nanowires 4 gradually turn and finally present in the form of substantially being distributed in the direction perpendicular to the contracting direction (that is, the length direction of the conductive nanowires 4 is substantially perpendicular to the first direction), thereby achieving the orientation of the conductive nanowires 4.

Preferably, the size of the liquid film 31 in the first direction after contracting is ⅙ to ½ of the size of the liquid film 31 in the first direction after expanding. Particularly, the size of the liquid film 31 in the first direction after contracting is between 10 mm and 300 mm.

That is to say, in the first direction, the liquid film 31 is preferably compressed to be ⅙ to ½ of the size of the liquid film 31 after expanding. This compression ratio can not only ensure the better orientation of the conductive nanowires 4, but also ensure the enough size of the liquid film 31.

Preferably, the operation conditions during the contracting of the liquid film 31 are similar to those during expanding, comprising: the ambient temperature is 25 to 30° C., the ambient relative humidity is 70 to 90%, and the contracting rate is in a range of 3 to 5 m/min.

In step S104 or S204, the liquid film 31 is transferred to a substrate 9.

The oriented conductive nanowires 4 obtained by the expanding and contracting steps can not be used directly because they are still distributed in the dispersion 3, thus the liquid film 31 should be transferred to other carriers, for example, transferred to a substrate 9.

Figure 5:
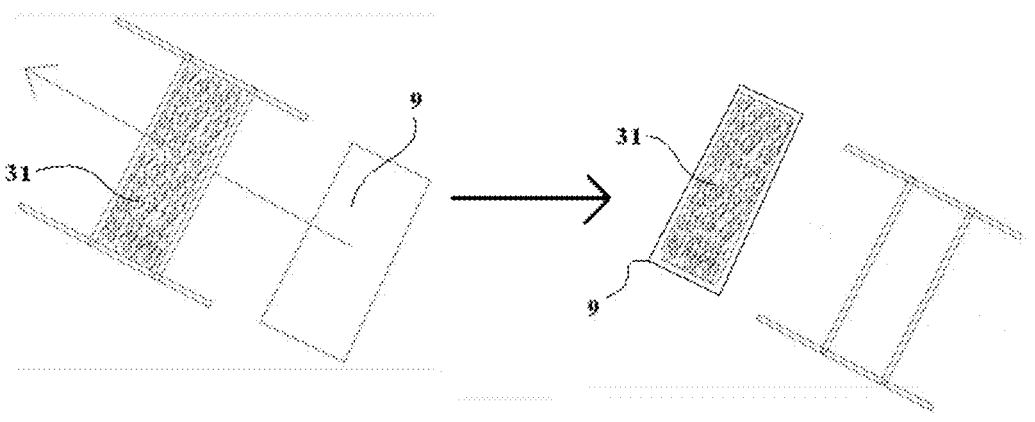
FIG. 5 is a schematic view showing the transference of a liquid film to a substrate according to the method for forming a conductive structure of the present invention.

Preferably, as shown in FIG. 5, this step may comprise: moving the substrate 9 gradually towards the liquid film 31 and making the surface of the substrate 9 come into contact with the liquid film 31, so as to "stick" the liquid film 31 on the substrate 9, thus finalizing the transference of the liquid film 31.

Particularly, the substrate 9 can be made of materials such as glasses, ceramics, polyethylene terephthalate (PET) and so on.

In step S105 or S205, the liquid film 31 is cured to form a first conductive film composed of the oriented nanowire material on the substrate 9.

Preferably, in this step, the liquid film 31 may be cured by heating, which includes heating at a temperature of 50 to 70° C. for 80 to 100 seconds and then heating at a temperature of 130 to 150° C. for 80 to 100 seconds.

That is to say, the liquid film 31 can be dried by heating after being transferred to the substrate 9, so as to make the oriented conductive nanowires 4 cured on the substrate 9, thus forming the first conductive film.

Preferably, the method for forming a conductive structure further comprises: repeating the above steps S201 to S205 to form additional conductive film(s) composed of the oriented conductive nanowire material on the substrate 9, wherein the additional conductive film(s) and the first conductive film are disposed to overlap each other, and the directions of the oriented conductive nanowires 4 in each conductive films are different from each other.

That is to say, other additional conductive film(s) can be overlapped on the first conductive film in the above manner, whereas the distribution directions of the oriented conductive nanowires 4 in different conductive films are different (i.e., perpendicular to each other). The total conductive films resulted can have good conductivity in each direction by forming multi-layer of conductive films having different orientation.

Preferably, the method for forming a conductive structure further comprises step S206: forming a conductive structure by the first conductive film and optionally additional conductive film(s) through a patterning process.

The oriented conductive nanowire material obtained in step S205 cannot be used directly although it can constitute a complete film material. It is necessary to form a desired pattern (conductive structure) through a patterning process. Specifically, the formed conductive structure can be any structure having conductivity such as electrodes, lead wires, etc. Preferably, the conductive structure can be any one or more structures selected from touch electrode (i.e., the electrode for realizing touch function) used in display substrate (for example, array substrate), grid electrode, pixel electrode, source electrode and drain electrode.

The "patterning process" conventionally comprises one or more steps of coating photoresist, exposing, developing, etching, stripping photoresist, etc. The conventional patterning process can be applied in step S206 to form a desired conductive structure by the above conductive film according to specific demand.

It is found that the following pattern process is preferably appropriate, which comprises the specific steps of:

S206-1: spin-coating a photoresist on the conductive film located on the substrate 9 at a rotation speed of 800 to 1200 rpm within 10 to 15 seconds;

S206-2: pre-baking at 100° C. for 100 to 150 seconds;

S206-3: exposing the photoresist with energy of 20 to 30 J/cm$^2$;

S206-4: post-baking at 130° C. for 150 to 200 seconds;

S206-5: developing in a developer at 25° C. for 25 to 35 seconds;

S206-6: etching in a etchant at 30° C. in an environment of 1 atm for 25 to 35 seconds; and S206-7: stripping in a stripper at 65° C. for 120 to 160 seconds to remove the remaining photoresist, thus obtaining the conductive structure.

It should be understood that the present invention is not limited to the above pattern process and can also be carried out by applying other pattern processes.

EXAMPLE

Example 1

An oriented nanowire material containing silver nanowires was prepared according to the method for forming an oriented nanowire material of the present invention, and the specific steps are as follows:

the silver nanowire-containing ClearOhm ink (manufactured by Cambrios Company, USA) was stirred by a magnetic stirrer (DF-101S, manufactured by Hitachi Test Equipment Institute, Changzhou) at a rate of less than 200 rpm for 10 min so as to obtain a uniform solution, wherein the ink has a viscosity of 20 cP, and the silver nanowires have a diameter of 50±10 nm and a length of 20 μm. The resulted solution was then dropwise added to the position between two mobile units 12 of a closed frame as shown in FIG. 3 to form a liquid film 31, wherein the two mobile units 12 was disposed at an interval of 0.2 mm. The closed frame is a rectangle closed frame having two supporting units 11 and two mobile units 12, and the two mobile units 12 both have a length of 60 mm.

The liquid film 31 was expanded in a first direction at an expanding rate of 3m/min under the conditions of ambient temperature of 25° C. and ambient relative humidity of 80%, and the size of the liquid film 31 after expanding reached to 300 mm.

The liquid film 31 was contracted in the first direction at a contracting rate of 3m/min under the conditions of ambient temperature of 25° C. and ambient relative humidity of 80%, and the size of the liquid film 31 after contracting narrowed to 60 mm.

Next, a glass substrate was brought close to the liquid film 31 so as transfer the liquid film 31 to the glass substrate.

The liquid film 31 on the glass substrate was heated at 60° C. for 90 seconds and then was heated at 140° C. for 90 seconds, thereby forming a conductive film composed of an oriented nanowire material on the glass substrate.

Then, an electrode made of the oriented silver nanowire material was obtained by the following steps: spin-coating a photoresist on the conductive film at a rotation speed of 1,000 rpm within 13 seconds, pre-baking at 100° C. for 130 seconds, exposing the photoresist with energy of 27 J/cm$^2$, post-baking at 130° C. for 170 seconds, developing in a developer at 25° C. for 30 seconds, etching in a etchant in an environment of 30° C. and 1 atm for 30 seconds, and stripping in a stripper at 65° C. for 140 seconds to remove the remaining photoresist.

Example 2

An oriented nanowire material containing silver nanowires was prepared according to the method for forming an oriented nanowire material of the present invention, and the specific steps are as follows:

the silver nanowire-containing Sliver Nanowire ink (manufactured by Nanopyxis Company, Korea) was stirred by a magnetic stirrer at a rate of less than 200 rpm for 10 min so as to obtain a uniform solution, wherein the ink has a viscosity of 25 cP, and the silver nanowires have a diameter of 30±10 nm and a length of 20 μm. The resulted solution was then dropwise added to the position between two mobile units 12 of a closed frame as shown in FIG. 3 to form a liquid film 31, wherein the two mobile units 12 was disposed at an interval of 0.2 mm. The closed frame is a rectangle closed frame having two supporting units 11 and two mobile units 12, and the two mobile units 12 both have a length of 300 mm.

The liquid film 31 was expanded in a first direction at an expanding rate of 3 m/min under the conditions of ambient temperature of 25° C. and ambient relative humidity of 80%, and the size of the liquid film 31 after expanding reached to 600 mm.

The liquid film 31 was contracted in the first direction at a contracting rate of 3 m/min under the conditions of ambient temperature of 25° C. and ambient relative humidity of 80%, and the size of the liquid film 31 after contracting narrowed to 150 mm.

Next, a glass substrate was brought close to the liquid film 31 so as transfer the liquid film 31 to the glass substrate.

The liquid film 31 on the glass substrate was heated at 60° C. for 90 seconds and then was heated at 140° C. for 90 seconds, thereby forming a conductive film composed of an oriented nanowire material on the glass substrate.

Then, an electrode made of the oriented silver nanowire material was obtained by the following step: spin-coating a photoresist on the conductive film at a rotation speed of 1,000 rpm within 13 seconds, pre-baking at 100° C. for 130 seconds, exposing the photoresist with energy of 27 J/cm$^2$, post-baking at 130° C. for 170 seconds, developing in a developer at 25° C. for 30 seconds, etching in a etchant in an environment of 30° C. and 1 atm for 30 seconds, and stripping in a stripper at 65° C. for 140 seconds to remove the remaining photoresist.

Comparative Example

The silver nanowire-containing ClearOhm ink (manufactured by Cambrios Company, USA) was stirred by a magnetic stirrer at a rate of less than 200 rpm for 10 min so as to obtain a uniform solution. 1 mL of the resulted dispersion was dropwise added to a glass substrate having a size of 60 mm×60 mm, and the dispersion was spin-coated at a rate of 600 rpm for 30 seconds by WS-650Hzb spin coater (manufactured by Laurell Company) according to a static spin-coating method. The liquid film on the glass substrate was heated at 60° C. for 90 seconds and then was heated at 140° C. for 90 seconds, thereby forming a conductive film composed of a silver nanowire material on the glass substrate. Then, an electrode made of the unoriented silver nanowire material was obtained by the same method as that in Example 1.

Evaluation

Figure 6:
FIG. 6 is a measuring microscope image (magnified 100 times) of an electrode made of an oriented silver nanowire material formed according to the method of the present invention.
Figure 7:
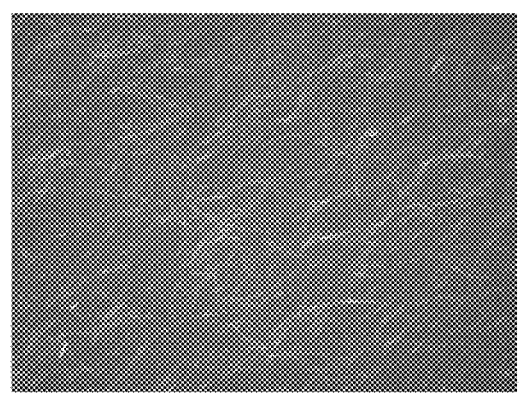
FIG. 7 is a measuring microscope image (magnified 100 times) of an electrode made of an unoriented silver nanowire material.

Each of the electrodes made in Example 1 and Comparative example was observed using a measuring microscope STM6-LM (manufactured by Olympus Company, magnified 100 times) and the observation results are shown in FIGS. 6 and 7.

It can be seen that, in the electrode made in Example 1, the silver nanowires (the white wires in FIG. 6) are distributed substantially in the same direction, whereas the nanowires (the white wires in FIG. 7) in the electrode made in Comparative example are distributed disorderly and unsystematic. Such results show that an electrode made of conductive nanowire material with good orientation can be obtained by the simple process of the present invention.

Figure 8:
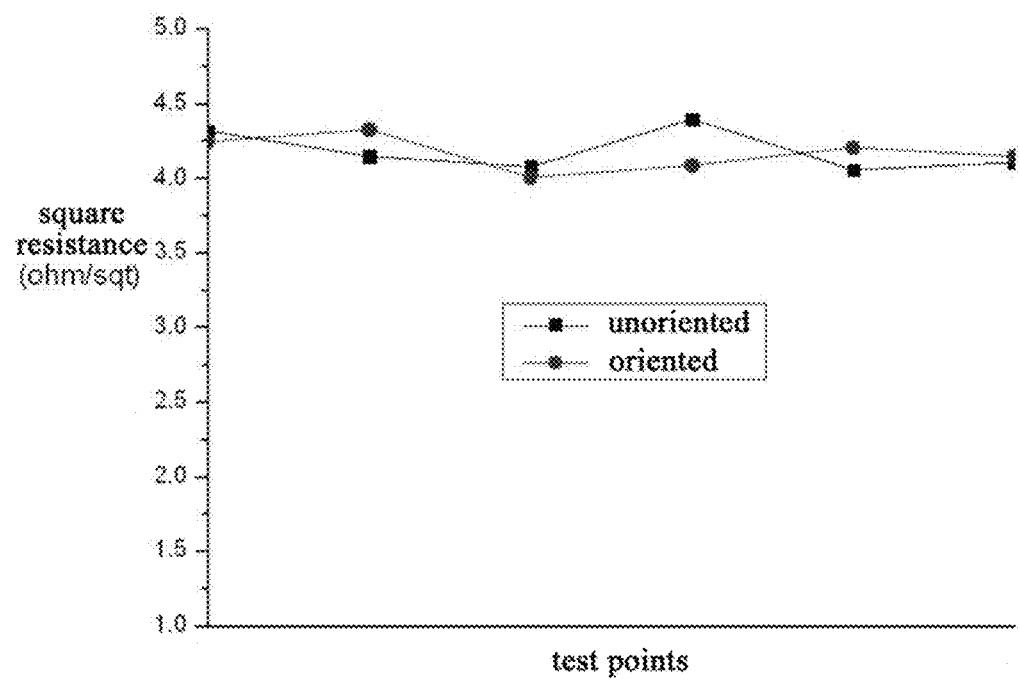
FIG. 8 is a diagram showing the comparison between the square resistance of the electrode made of an oriented silver nanowire material and that of the electrode made of an unoriented silver nanowire material.

Each of the square resistances of the electrode made of the oriented silver nanowire material prepared in Example 1 and the electrode made of the unoriented silver nanowire material prepared in Comparative example was tested and the results are shown in FIG. 8.

It can be seen that the two electrodes substantially have the same square resistance, indicating that the square resistance of the electrode made of the oriented silver nanowire material prepared in Example 1 would not be decreased.

Figure 9:
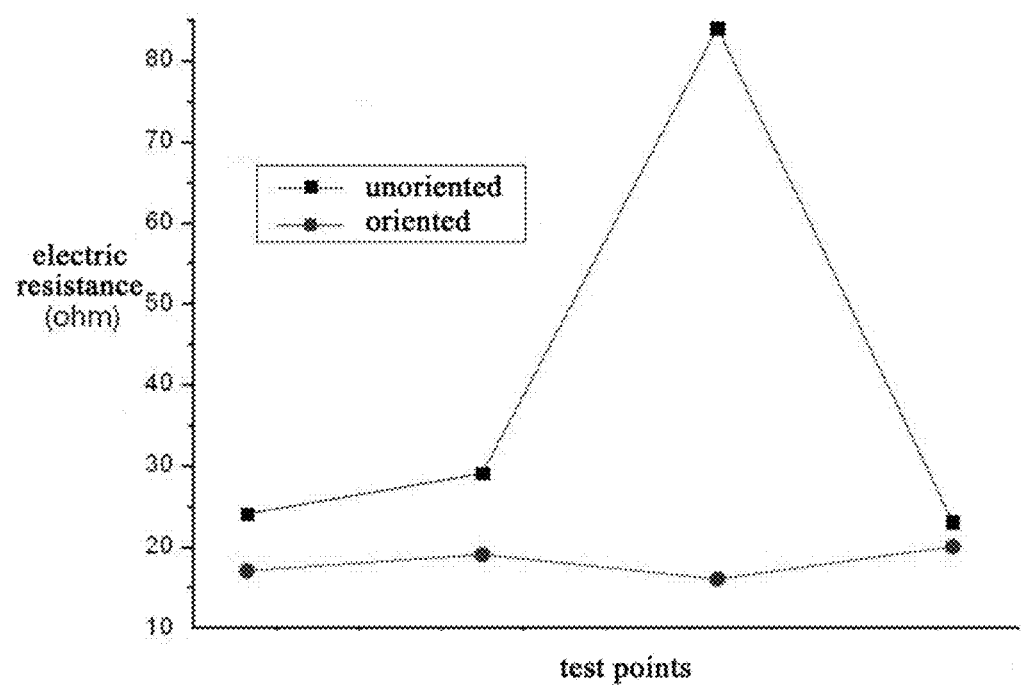
FIG. 9 is a diagram showing the comparison between the electric resistance of the electrode made of an oriented silver nanowire material in its orientation direction and the electric resistance in the same direction of the electrode made of an unoriented silver nanowire material.

The electric resistance of the electrode made of the oriented silver nanowire material prepared in Example 1 in the orientation direction of the silver nanowires as well as the electric resistance of the electrode made of the unoriented silver nanowire material prepared in Comparative example in the same direction was tested and the results are shown in FIG. 9.

It can be seen that the electric resistance of the electrode made of the unoriented silver nanowire material is significantly larger than that of the electrode made of the oriented silver nanowire material, and the difference of the electric resistances at some test points especially apparent. The reason for this is that, in some points of the electrode composed the unoriented silver nanowires, the silver namowires do not connect with each other or only a few of the silver nanowires connect with each other, which is similar to a case of "broken wire", thereby causing the electric resistance increases sharply. In contrast, in the electrode made of the oriented silver nanowire material, the silver nanowires are distributed substantially in their orientation direction so that the case of "broken wires" would not occur and the electric resistance is small and uniform.

It should be understood that the embodiments described above are merely the exemplary embodiments illustrating the principles of the present invention, which shall not limit the scope of the invention. Various changes and modifications to the present technical solutions made without departing from the spirit of invention by a person skilled in the art should all be covered in the protection scope of the present invention.

The invention claimed is:

1. An apparatus for forming an oriented nanowire material, characterized by comprising:
    a closed frame constructed by two supporting units and two mobile units, which is used for forming a liquid film therein by a dispersion containing nanowires, and which is capable of expanding and contracting in a first direction so that the nanowires in the dispersion can be oriented;
    wherein at least one of the mobile units has an injection hole, a slit and a channel, wherein the channel is disposed inside the mobile unit for connecting the injection hole with the slit; the injection hole is used for adding the dispersion containing nanowires into the mobile unit; and the slit is disposed at the side of the mobile unit opposite to the other mobile unit such that a liquid film is formed between the two mobile units when the dispersion containing nanowires flows out of the slit; and
    wherein the liquid film is in a plane formed by the two supporting units and the two mobile units;
    characterized in that the expanding and the contracting rates are both in a range of 3 to 5 m/min; and
    characterized in that the size of the liquid film in the first direction after being contracted is in a range of 10 to 300 mm.

2. The apparatus for forming an oriented nanowire material according to claim 1, characterized by further comprising a driving unit used for driving the closed frame to move.

3. The apparatus for forming an oriented nanowire material according to claim 1, wherein
    the two supporting units are disposed at an interval and are parallel to the first direction; and
    the two mobile units are disposed at an interval and are perpendicular to the first direction, wherein at least one of the mobile units is capable of moving in the first direction.

4. The apparatus for forming an oriented nanowire material according to claim 3, characterized in that the vertical distance between the two supporting units disposed at an interval is 10 to 400 mm.

5. The apparatus for forming an oriented nanowire material according to claim 1, characterized in that the size of the liquid film in the first direction before being expanded is 0.3 mm or less.

6. The apparatus for forming an oriented nanowire material according to claim 1, characterized in that the size of the liquid film in the first direction after being expanded and before being contracted is in a range of 60 to 1000 mm.

* * * * *